(12) United States Patent
Christen et al.

(10) Patent No.: US 6,491,759 B1
(45) Date of Patent: Dec. 10, 2002

(54) COMBINATORIAL SYNTHESIS SYSTEM

(75) Inventors: Hans M. Christen, Greenbelt, MD (US); Sherwood D. Silliman, Laurel, MD (US)

(73) Assignee: Neocera, Inc., Beltsville, MD (US)

( * ) Notice: Subject to any disclaimer, the term of this patent is extended or adjusted under 35 U.S.C. 154(b) by 0 days.

(21) Appl. No.: 09/524,611

(22) Filed: Mar. 14, 2000

(51) Int. Cl.⁷ ................. C23C 16/00; H01L 21/00
(52) U.S. Cl. ................. 118/722; 118/723 VE; 118/723 CB; 118/723 EB
(58) Field of Search .......... 118/722, 723 VE, 118/723 CB, 723 EB, 724, 730; 427/554, 555, 556, 596, 597, 568, 561

(56) References Cited

U.S. PATENT DOCUMENTS

| | | | | |
|---|---|---|---|---|
| 5,015,492 A | * | 5/1991 | Venkatesan et al. | 427/8 |
| 5,028,584 A | * | 7/1991 | Schultheiss | 505/1 |
| 5,212,148 A | * | 5/1993 | Roas et al. | 505/1 |
| 5,483,037 A | * | 1/1996 | Mashburn | 219/121.68 |
| 5,534,071 A | * | 7/1996 | Varshney et al. | 118/726 |
| 5,672,210 A | * | 9/1997 | Moto et al. | 118/726 |
| 5,711,810 A | * | 1/1998 | Sengupta | 118/722 |
| 5,893,952 A | * | 4/1999 | Aronowitz et al. | 118/725 |
| 5,985,356 A | | 11/1999 | Schultz et al. | |
| 5,989,397 A | * | 11/1999 | Laube et al. | 204/298.03 |
| 6,063,455 A | * | 5/2000 | Jeong et al. | 427/596 |
| 6,312,768 B1 | * | 11/2001 | Rode et al. | 427/596 |

FOREIGN PATENT DOCUMENTS

| | | | | |
|---|---|---|---|---|
| JP | 404048070 A | * | 2/1992 | 118/722 |
| JP | 06-279180 | * | 4/1994 | |
| JP | 06-293958 | * | 10/1994 | |

OTHER PUBLICATIONS

Hanak, "The 'Multiple-Sample Concept' in Materials Research: Synthesis, Compositional Analysis and Testing of Entire Multi-component Systems," Journal of Material Science, vol. 5, 1970, pp. 964–971.

Ouellette, "Combinatorial Materials Synthesis," The Industrial Physicist, Dec. 1998, pp. 24–27.

van Dover et al., "Discovery of a useful thin-film dielectric using a compositional-spread approach," Nature, vol. 392, Mar. 12, 1998, pp. 24–27.

van Dover, "Amorphous lanthanide-doped TiOx dielectric films," Applied Physics Letters, vol. 74, No. 20, May 17, 1999, pp. 3041–3043.

Product information from Kurt J. Lesker Company Web Site, date unknown.

* cited by examiner

Primary Examiner—Gregory Mills
Assistant Examiner—Michelle Crowell
(74) Attorney, Agent, or Firm—Rosenberg, Klein & Lee (57) ABSTRACT

A combinatorial synthesis system is provided which combines pulsed laser deposition techniques with the continuous composition spread technique in which a plurality of targets made of different ingredient materials are arranged in a predetermined relationship and are ablated by an energetic beam focused on the surface of a particular target. By maintaining the energetic beam in a stationary state, the target carousel is rotated so as to bring a particular target in engagement with the energetic beam. The targets are brought into engagement with the energetic beam in a predetermined sequence so that different materials are deposited onto the substrate in a predetermined sequence. Distributed deposition areas surround each deposition center and overlap each with the other to form a continuous compositional spread on the surface of the substrate.

15 Claims, 6 Drawing Sheets

COMBINATORIAL SYNTHESIS SYSTEM

FIELD OF THE INVENTION

The present invention relates to the field of materials research, and more in particular, to simultaneous creation of numerous diverse compounds in one step for further analysis, testing, and evaluating of different properties of these compounds as the entire multi-component system created on a single substrate.

The present invention further relates to a combinatorial synthesis technique which is based on pulsed laser deposition or other deposition techniques based on ablation due to an energetic beam such as a pulsed electron beam, in combination with a continuous composition spread technique resulting in a deposition film formed on a substrate having a continuously varying composition of a plurality of selected ingredient materials.

Further, the present invention relates to a combinatorial synthesis system and method in which a plurality of targets are ablated in a predetermined sequence by an energetic beam, such as a laser beam or a pulsed electron beam, such that the ejected materials reach a substrate at predefined locations thereon and form a plurality of deposition centers on the substrate. Each deposition center is surrounded by a distributed deposition area with a lower concentration of the material than at the corresponding deposition center. The distributed deposition areas of all deposition centers overlap each other forming a deposition film on the surface of the substrate having a continuously varying composition of the ingredient materials of the targets.

The present invention still further relates to a combinatorial synthesis system in which each target during the time of exposure to energetic pulses, such as laser pulses, is aligned with a corresponding deposition center on the substrate by means of a control mechanism which controls a mutual disposition between the energetic beam, targets, and the substrate in the following manner:

A. Either the energetic beam is maintained immovable, and the targets are displaced (rotated on the target carousel) to bring a target into operational engagement with the energetic beam, additionally, the substrate is rotated to align the predefined deposition center with a corresponding target; or B. The substrate and/or the targets are maintained stationary and the energetic beam is steered from target to target which may or may not be repositioned during the deposition. The energetic beam also may be controlled to scan over the surface of a particular target to further control the composition deposited on the substrate.

A deposition film created in this manner on the surface of the substrate having a continuously varying composition of the ingredient materials may then be further analyzed, tested, and evaluated in searching for a compound having specific physical, electrical, optical, etc., properties.

BACKGROUND OF THE INVENTION

Combinatorial chemistry was introduced in the mid 1980s as a method by which drug researchers could quickly make and evaluate a large number of products and check the biological activity. Combinatorial chemistry has attracted intense interest in the scientific community. Combinatorial chemistry is an approach in which a large number of compounds are synthesized without thorough predictions of likely reactions or the properties of the resulting substances.

In its basic parallel synthesis form, combinatorial chemistry uses an array of tiny wells in a plastic sheet filled row by row with chemicals A1, A2, A3 . . . , and column by column with reacting chemicals B1, B2, B3 . . . Each well's reaction product is analyzed with a generalized test of biological activity and those giving positive results are pursued.

More recently, the combinatorial approach has been applied to thin film materials synthesis with the expectations of developing new luminescent materials, magnetoresistive compounds, dielectric and ferroelectric materials, catalysts, polymers, and high-$T_c$ superconductors. In this approach, an array of thin film squares are deposited on a single substrate, each with a slightly different composition. Presently, researchers are applying combinatorial chemistry techniques to optical, electronic, superconductive and magnetic materials for differences in bulk compositions, layer compositions, layer thicknesses, composition changes with respect to depth, and magnetic properties. Present day material science examines the small compositional differences that may induce profound property changes.

Figure 1A:
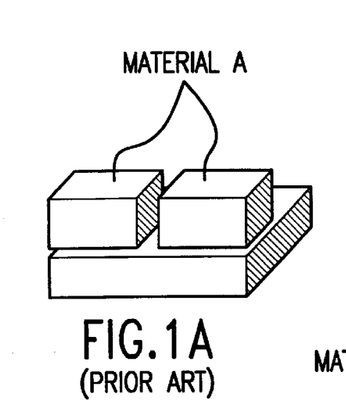
FIGS. 1A–1E are schematic representations of discrete combinatorial synthesis technique of the prior art.
Figure 1B:
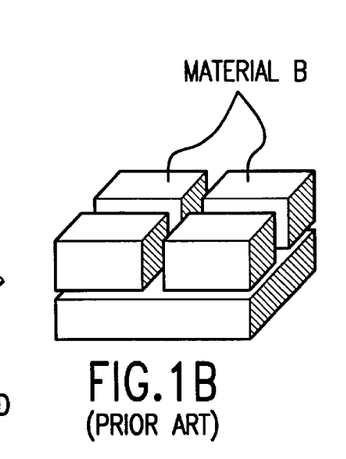
Figure 1C:
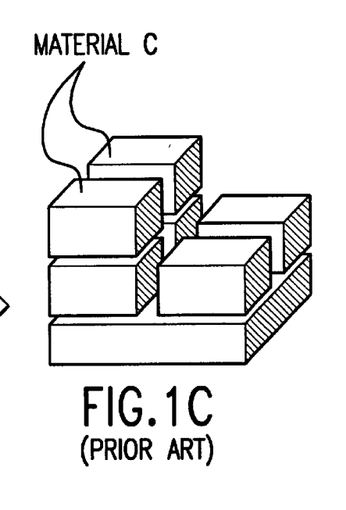
Figure 1D:
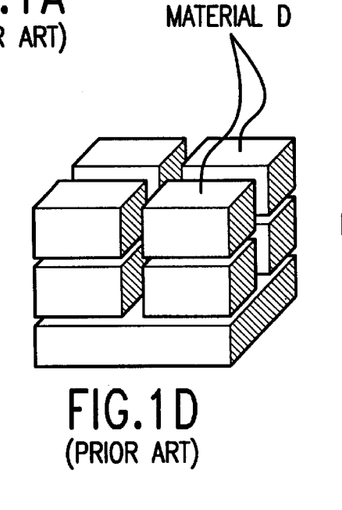
Figure 1E:
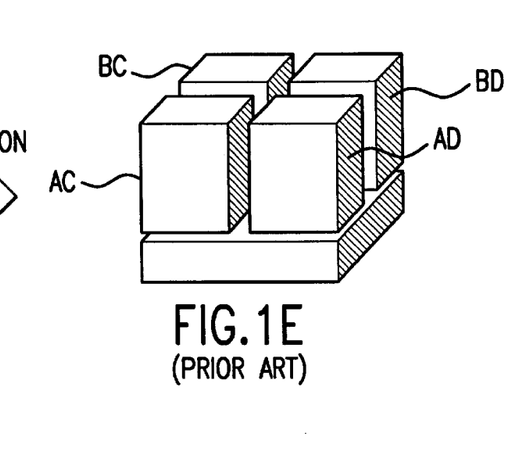

There are several techniques in the combinatorial chemistry used to create a plurality of different compounds on a single substrate for further analysis, testing and evaluation. In the discrete combinatorial synthesis (DCS) approach, a series of masks is used to deposit separate layers of the ingredient materials. As shown in FIGS. 1A–1D, different materials A, B, C, and D are deposited in sequence through masks (not shown) followed by a high temperature anneal to promote reaction of the components. This forms different compounds of the ingredient materials, as shown in FIG. 1E. Large numbers of materials may be synthesized in a single run. The masks have to be brought in close contact with the substrate in order to permit the required spatial resolution. In many situations this requires the deposition to take place at room temperature since handling of complex delicate masks at elevated temperatures poses a difficulty.

More fundamentally, discrete combinatorial synthesis techniques require a high temperature anneal after deposition of the precursor layers in order to promote intermixing of the components and is thus not suitable for the exploration of low temperature processed materials.

A high temperature DCS system has been developed by Pascal Corporation, Ltd. (Japan). Disadvantageously, this system allows a very limited number of compositions to be generated per run at a relatively high cost. Clearly, the elevated cost of such systems in combination with the limited number of compositions generated per run prohibit commercial widespread use.

Another discrete combinatorial synthesis system is described in U.S. Pat. No. 5,985,356 in which a substrate having an array of diverse materials thereon is generally prepared by delivering components of materials to predefined regions on a substrate. Simultaneously the components are reacted to form at least two materials. In this system, eight RF magnetron sputtering guns each of which contains a reactant component of interest are located above a disk containing eight masking patterns as well as eight film thickness monitors.

The magnetron sputtering guns, as well as the disk, are fixed in this system. The substrate is coupled to a substrate manipulator which is capable of linear and rotational motion and which engages the substrate with a particular mask of interest so that the substrate is in contact with the mask when the sputtering is initiated. Combinations of the eight components are generated on the substrate by the sequential deposition of each component through its respective mask.

To overcome deficiencies of the described combinatorial synthesis techniques, the continuous composition spread (CCS) technique has been introduced in 1970 by J. T. Hanak. In this type of proposed system films are deposited by co-sputtering from a disk-shaped target consisting of 120° sectors of three different materials. In 1998, R. B. Van Dover, et al. introduced a CCS technique by reactive co-sputtering using planar magnetron sputter guns arranged at 90° intervals around a rectangular substrate. Zr, Ti and Sn guns are typically run at 150 watt, 75 watt, and 20 watt of radio frequency power, respectively, in order to provide the desired Zr/Ti/Sn composition at the substrate midpoint. The deposited film constitutes a single film with a ternary composition spread, the critical properties of which are evaluated as a function of position.

The composition was inferred as a function of position using Rutherford backscattering spectroscopy together with independent calibration runs allowing a mapping of the "useful figure of merit" (FOM) data onto a conventional ternary phase diagram. The same CCS approach was used in 1999 for the discovery of an amorphous high-K dielectric.

As an alternative approach, a mask based post anneal approach to continuous composition spread technique has been proposed by Kurt J. Lesker Company, in which continuous "wedges" of each component are deposited using a moving shutter in a sputter system. The tool is commercially available under the name "CMS".

Despite the advantages of the conventional continuous composition spread technique over the discrete combinatorial synthesis approach such a technique requires large sputter targets. Thus, conventional systems fail to enjoy the benefits of pulsed laser deposition technique allowing for use of small targets. It is known to those skilled in the art that pulsed laser deposition is a proven prototyping method with advantages over sputtering, evaporation, or CVD (chemical vapor deposition) approaches. In the pulsed laser deposition technique, a laser beam impinges on the surface of a target formed of a predetermined material composition and ablates the target thus ejecting the particulates of the material of the target towards a substrate where the material is deposited.

In view of the disadvantages of discrete combinatorial synthesis and sputter based continuous composition spread technique it is advantageous to provide a combinatorial synthesis approach which enjoys the positive features of the continuous composition spread technique in combination with pulsed laser deposition which allows deposition of materials under similar conditions with a similar growth rate as well as permitting use with small targets which are sufficient for most applications and thus available for virtually all desirable material.

SUMMARY OF THE INVENTION

It is therefore an object of the present invention to provide a combinatorial synthesis technique based on pulsed laser deposition technology or other deposition approach based on ablation or sputtering due to an energetic beam, such as a pulsed electron beam, and continuous composition spread techniques for creating a deposition film having a continuously varying composition of ingredient materials and allows an unlimited number of materials to be deposited on a substrate while removing the disadvantage of contamination due to contact with a mask.

It is another object of the present invention to provide a combinatorial synthesis technique which permits creation of a high number of different compounds in a single run in a highly cost effective manner.

It is a still further object of the present invention to provide a combinatorial synthesis system in which a plurality of targets are brought in direct contact with an energetic beam in a predetermined sequence in order that the surface of each target is ablated and the material particles are ejected towards the substrate where they are deposited at a predefined deposition center surrounded by a distributed deposition area. The distributed deposition areas of all deposition centers on the substrate are generally in overlapping relation so that a final deposition film created on the surface of the substrate constitutes an uninterrupted spread with a continuously varying composition of the materials of the targets. The deposition film is further analyzed, tested and evaluated on the basis of measurements of the thickness of the entire multi-component film at a few selected points that is sufficient to determine the elemental distribution.

It is a further object of the present invention to provide a combinatorial synthesis system in which either the energetic beam is maintained immovable while the targets and the substrate are displaced from their original position for inter-alignment and inter-engagement between all required parts of the system, or the energetic beam steers from one target to another and is capable of scanning over the surface of each particular target, and where the position of the targets and/or substrate additionally may be changed during the deposition.

In accordance with the teaching of the present invention, the combinatorial synthesis system includes a plurality of targets supported on a target carousel or other target positioning equipment and arranged thereon in a predetermined relationship therebetween. Each target is formed of a respective material which serves as an ingredient material for creation of a plurality of ingredient materials compound. A substrate is displaced from the targets a predetermined distance. A plurality of deposition centers are defined on the substrate in correspondence to the targets.

An energetic beam such as a laser beam, a pulsed electron beam, etc. is directed towards one of the targets for ablating the surface of the target and ejecting particulates of the "ingredient" material of the target towards the substrate. The ejected particulates are deposited at the corresponding deposition centers and at a distributed deposition area surrounding each deposition center. The distributed deposition areas of the deposition centers on the substrate overlap each with the other, thus forming a continuously spread deposition film on the surface of the substrate having a continuously varying composition of the ingredient materials.

It is essential that the combinatorial synthesis system of the present invention include a control mechanism adapted to control mutual disposition between the energetic beam, targets and the substrate and in particular provides coordination between the targets and corresponding deposition centers. The control mechanism may maintain the energetic beam immovable while rotating the target carousel to bring the targets in contact with the stationary energetic beam sequentially, and rotate the substrate in order to align the deposition center with the corresponding target. Alternatively, the substrate and/or the targets are maintained stationary while the control mechanism steers the energetic beam from one target to another in a predetermined sequence. It is important that the energetic beam can be steered not only from one target to another, but that also the energetic beam is capable of scanning the surface of each target.

In the system using the immovable energetic beam, the rotation of the target carousel and alignment of the substrate with the targets is performed between the energetic pulses. In the system using a steered energetic beam, the focusing of the energetic beam on a required target is also performed between the pulse generation. For each target, the number of laser or electron beam pulses or the duration of exposure to an ion beam is determined by the control mechanism.

The targets may be formed as disk-shaped targets spaced each from the other on the target carousel or they may be formed as wedge-shaped targets radially disposed on the common disk-shaped support on which they are angularly spaced each from the other.

Preferably, the substrate is positioned in direct contact with the heater with all elements of the system received in the vacuum chamber.

The substrate can linearly move towards and away from the targets to provide a flexibility of use in depositing the ingredient materials onto the substrate surface.

Viewing in another aspect thereof, the present invention is a combinatorial synthesis method which includes the steps of directing an energetic beam towards one of a plurality of targets and varying disposition in a predetermined sequence between the energetic beam and the target (either with the immovable energetic beam or with steerable energetic beam).

It is essential that the composition deposited on the substrate varies continuously between different regions of the substrate and can be further analyzed by determining the compositional map across the sample without having to perform sophisticated chemical analysis. Measurement of the thickness of the entire multi-component film at a few selected points has been found to be sufficient in determining the elemental distribution based on a few basic assumptions that can be verified periodically on test wafers.

These and other novel features and advantages of this invention will be fully understood from the following detailed description of the accompanying drawings.

DETAILED DESCRIPTION OF THE PREFERRED EMBODIMENT

Figure 2:
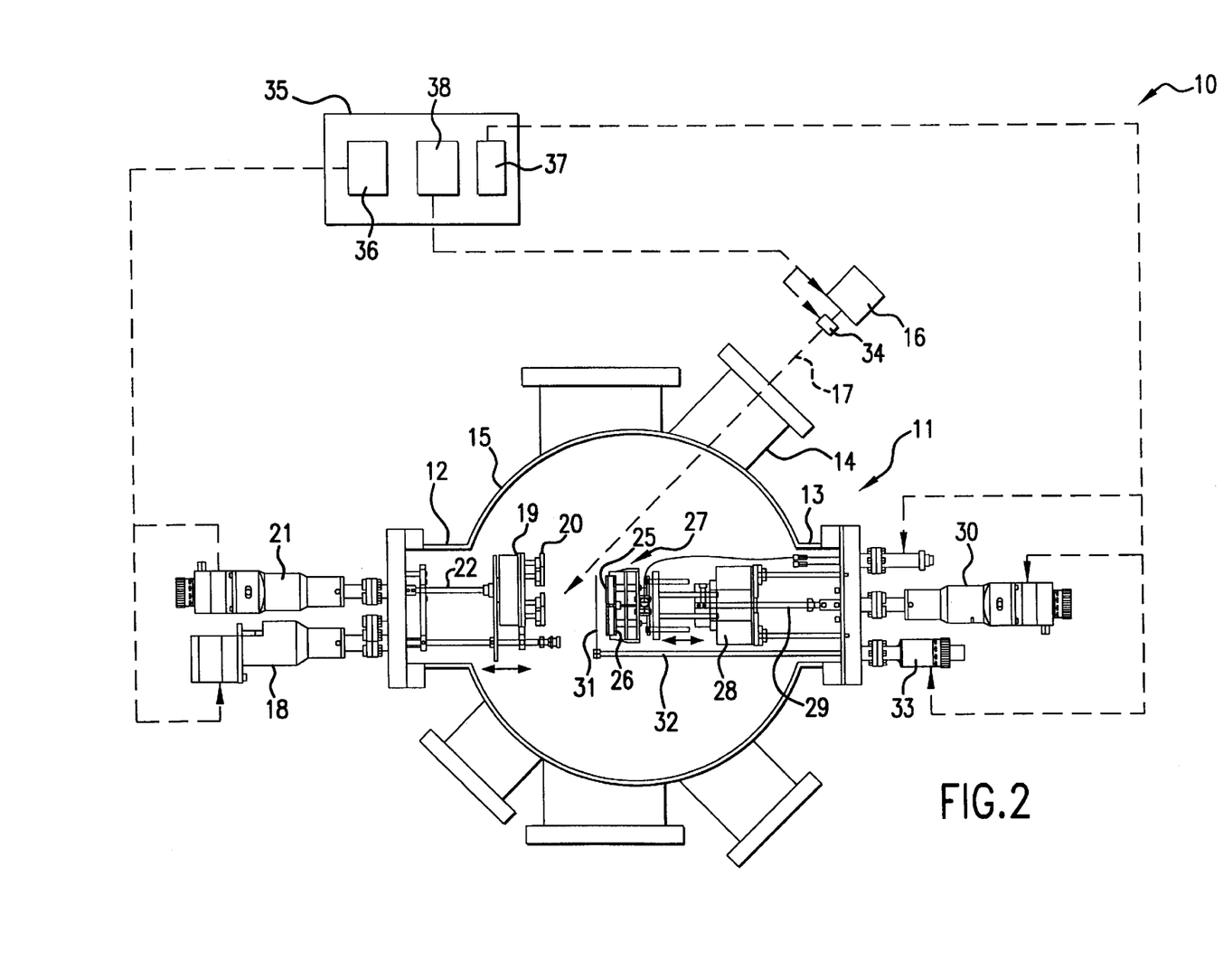
FIG. 2 shows schematically the overall design of the system of the present invention.

Referring to FIG. 2, the combinatorial synthesis system 10 of the present invention includes a vacuum chamber 11 having a target port 12, substrate port 13, and a laser port 14 defined in the walls 15 of the vacuum chamber 11 in the case of an external energy source, such as a laser 16. The laser 16, which may be an excimer laser, is positioned on the axis of the laser port 14 so that when the laser 16 generates a laser beam 17, the laser beam is focused onto the required target to impinge on the surface of the target.

A different energy source such as a pulsed electron beam, etc., can be used in place of the pulsed laser beam. In the case of the different energy source, such as a pulsed electron beam, the port 14 may be adapted to mount an internal energy source in a way to allow the pulsed electron beam to engage the surface of one of the targets.

A motor 18 is operationally coupled to the rotational axis of the target carousel to rotate the target carousel 19. Each target 20 on the target carousel 19 is able to rotate independently by means of motor 21 which has a common shaft 22 operationally coupled with each target 20 gear-like mechanism (not shown) received within the target carousel 19 and known to those skilled in the art.

The substrate 25 is disposed on a heater 26 which is electrically coupled to a power source for heating purposes when needed to achieve a required temperature. The heater/substrate unit 27 is affixed onto a heater/substrate rotating unit 28 operationally coupled to a shaft 29 of a substrate rotation motor 30. The substrate shutter 31 is affixed to a shaft 32 of a motor 33 provided for rotating the substrate shutter 31 to interrupt communication between the target system and the substrate 25.

Care must be taken to obtain the needed degree of vacuum within the vacuum chamber 11. For these purposes, different gaskets, sealants and other measures known to those skilled in the art are provided to seal the ports and other openings within the walls 15 of the vacuum chamber 11 vulnerable to a leak.

The laser 16 is provided with an optical system 34 schematically shown in FIG. 2, and known to those skilled in the art, which provides focusing of the laser beam 17 and steers it from target to target as well as to provide scanning over a certain angular region.

A control unit 35, which may be a computer processor coordinating the performance of the overall system 10, includes rotational mechanism 36 operationally coupled to the motors 21 and 18 for rotating the target carousel 19 and each target 20. The control unit 35 further includes a control mechanism 38 for controlling the laser 16 and the optical system 34 to steer, scan and focus the laser beam 17. Also embedded into the control unit 35, is a rotational substrate mechanism 37 operationally coupled to the motors 30 and 33 for rotating the substrate 25 when needed. Further, control unit 35 controls a means for translation of the substrate 25, as indicated by the horizontal arrow shown in FIG. 2.

All mechanisms 36, 37 and 38 are controlled by the control unit 35 to precisely coordinate targets 20, substrate 25, and laser beam 17 during operation of the system 10 of the present invention and to control the number of laser pulses for each target.

A wide variety of substrates can be employed in the system of the present invention. The substrates, for example, may be organic, inorganic, biological, non-biological, or a combination thereof, existing as particles, strains, gels, sheets, tubing, spheres, containers, capillaries, pads, slices, films, plates, slides, etc. The substrate may have any convenient shape, such as a disk, square, sphere, circle, etc. The substrate is preferably flat but may take on a variety of alternative surface configurations.

The material of substrate may include a wide variety of materials such as for example polymers, plastics, pyrex, quartz, resins, silicon, silica or silica based materials, carbon, metal, inorganic glasses, inorganic crystals, membranes, etc. The most appropriate substrate and substrate surface materials will depend on the class of materials to be synthesized and the selection of any given case will be readily apparent to those of skill in the art.

Figure 8:
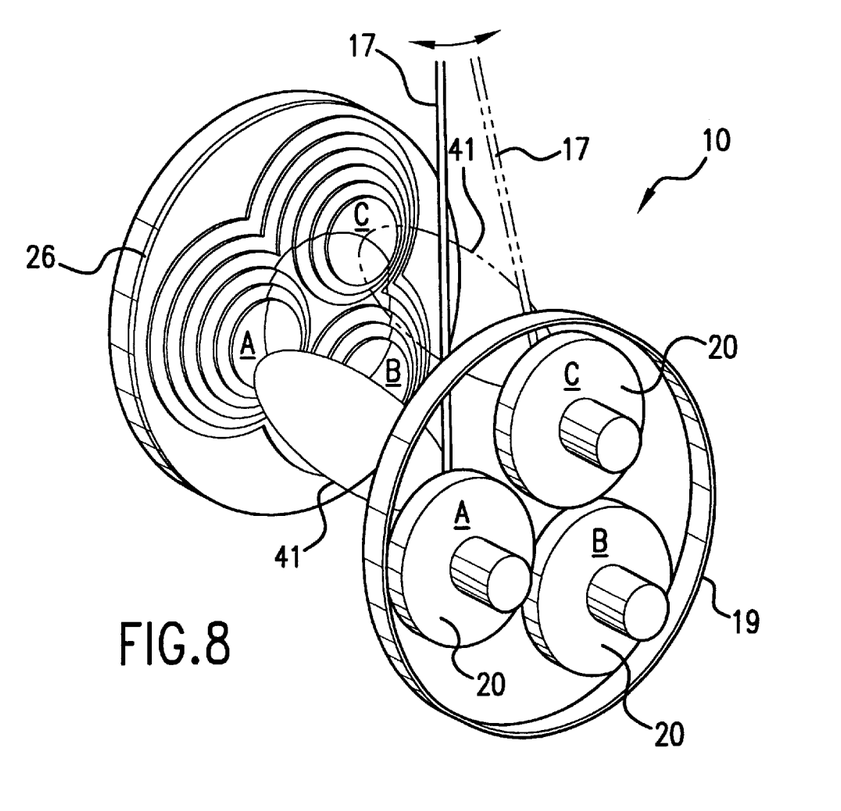
FIG. 8 shows schematically another implementation of the system of the present invention with steerable laser beam; and, FIG. 9 shows schematically an alternative target arrangement.
Figure 9:
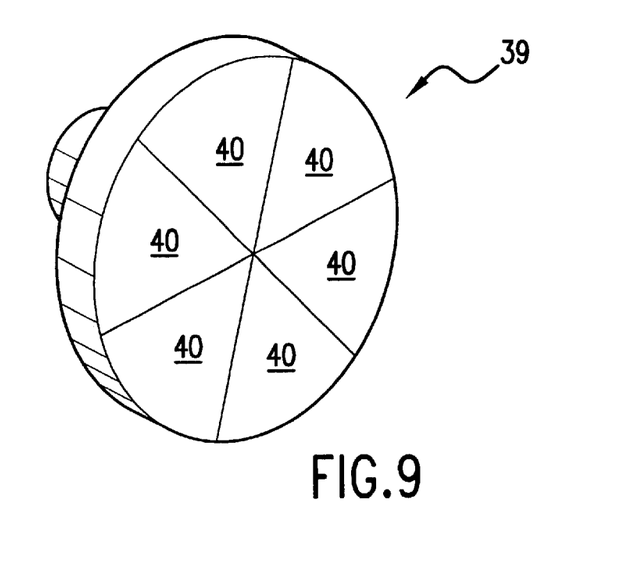

The targets 20 may have a disk-shaped form as shown in FIGS. 3A, 3B, 4A–C, 5 and 8, or they may be formed on a common target surface 39, as shown in FIG. 9 consisting of "pizza slice-shaped" wedges 40, each of which is formed of different ingredient materials and each serving as a separate target. Alternatively, targets may also be shaped as cubes, cylinders, or any other convenient shape.

The ingredient materials of the targets 20 as well as the wedges 40 (shown in FIG. 9) include a wide variety of different materials which are to be used as ingredient materials for the final compositions to be created on the surface of the substrate 25, depending on the purpose of the synthesis performed in the system of the present invention. They may include high temperature or low temperature materials.

Figure 3A:
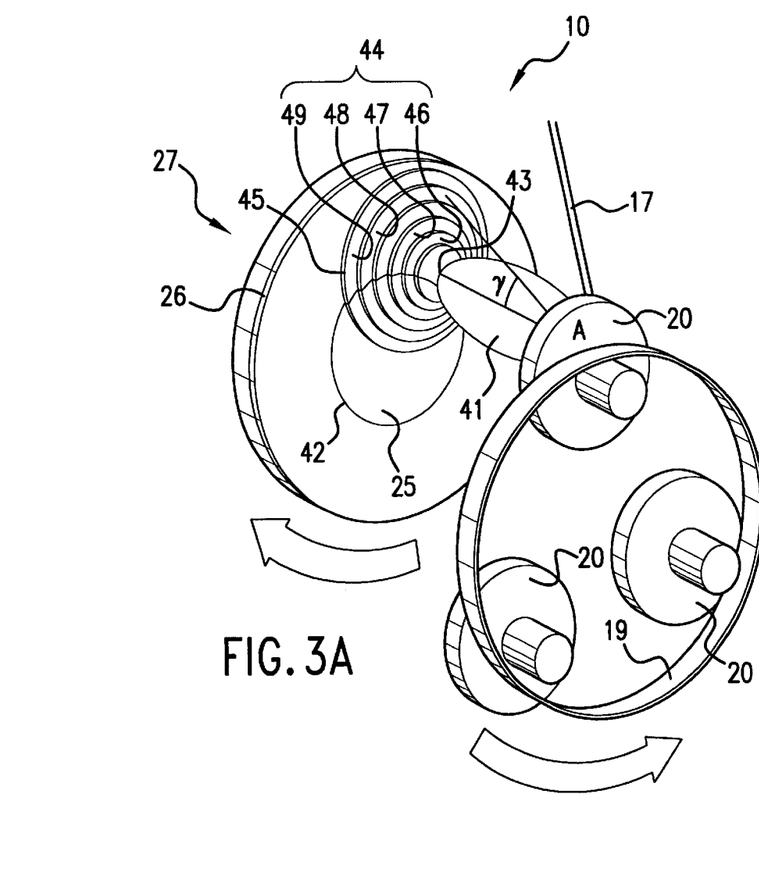
FIG. 3A shows schematically a system of the present invention with a three target carousel and with the laser beam focused on one target.

Although any number of targets can be used in the system of the present invention, as an example, FIG. 3A shows a combinatorial synthesis system with a three target carousel 19. Each of the targets 20 is a disk-shaped target of a predetermined diameter secured to the target carousel 19 and capable of being exchanged when exhausted.

The laser beam 17 is focused on one target 20 and the plume 41 is directed towards the substrate 25 located on the heater plate 26. Preferably, the plume center coincides with the edge 42 of the substrate 25. As an example when the laser beam 17 is focused on the target formed of ingredient material A shown in FIG. 3A, the particles of the material A are ejected from the surface of the target 20 and form the plume 41 which covers the distance between the target 20 and the surface of the substrate 25 and deposits the particles of the material A onto the respective deposition center 43 corresponding to the target formed of the material A.

It is clear to those skilled in the art that the very center of the deposition center 43 has the largest thickness of the deposited layer of the material A, while the distributed deposition area 44 surrounding the deposition center 43 has a thickness of the deposited layer of the material A decreasing radially from the very center of the deposition center 43 to the periphery 45 of the distributed deposition area 44.

Figure 6A:
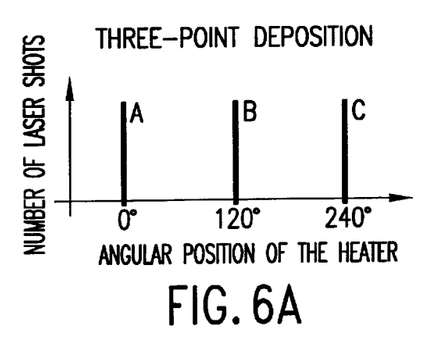
FIGS. 6A and 6B show respectively a simplest three point deposition and distributed deposition which results in a different thickness profile across the substrate.
Figure 6B:
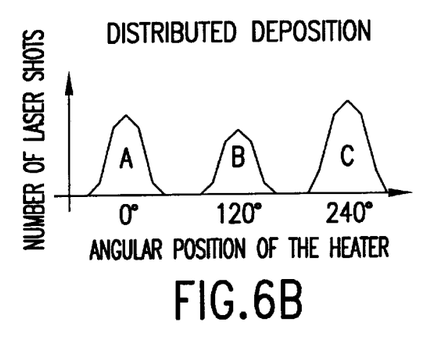

In a simplified manner, each deposition center 43 is surrounded by the distributed deposition area 44 and may be represented as a plurality of concentric rings 46, 47, 48, 49, etc., the profile thickness of which diminishes in the direction from the deposition center 43 to the periphery 45 of the distributed deposition area 44 as is schematically shown in FIG. 6B.

Keeping the target 20 aligned with the corresponding deposition center 43 during a predetermined number of laser pulses, when the laser beam 17 ejects material A from the target 20, the deposition center 43 along with the distributed deposition area 44 of the material A is formed on the substrate 25 as shown in FIG. 3A.

In order to deposit the next material, for example, material B from the target 20, maintaining the laser beam stationary, the carousel 19 is rotated by the motor 18 in a manner to bring the target 20 formed of material B in contact with the laser beam 17. Simultaneously, the heater 26 with the substrate 25 is rotated by the motor 30 to align another predefined deposition center 50 with the target 20 formed of the material B. The ablation process is then repeated as was accomplished with material A as described in previous paragraphs.

The resulting thickness profile of the deposited material B on the substrate 25 also decreases from the center of the deposition center 50 to the periphery of the corresponding distributed deposition area 51 thereof. Similarly, in order to deposit material C from the target 20, the target carousel 19 is rotated by actuation of the motor 18 until the surface of the target 20 formed of material C is brought into contact with the laser beam 17 and the substrate 25 is rotated by the motor 30 to bring the respective deposition center 52 into alignment with the target 20 formed of material C.

Figure 3B:
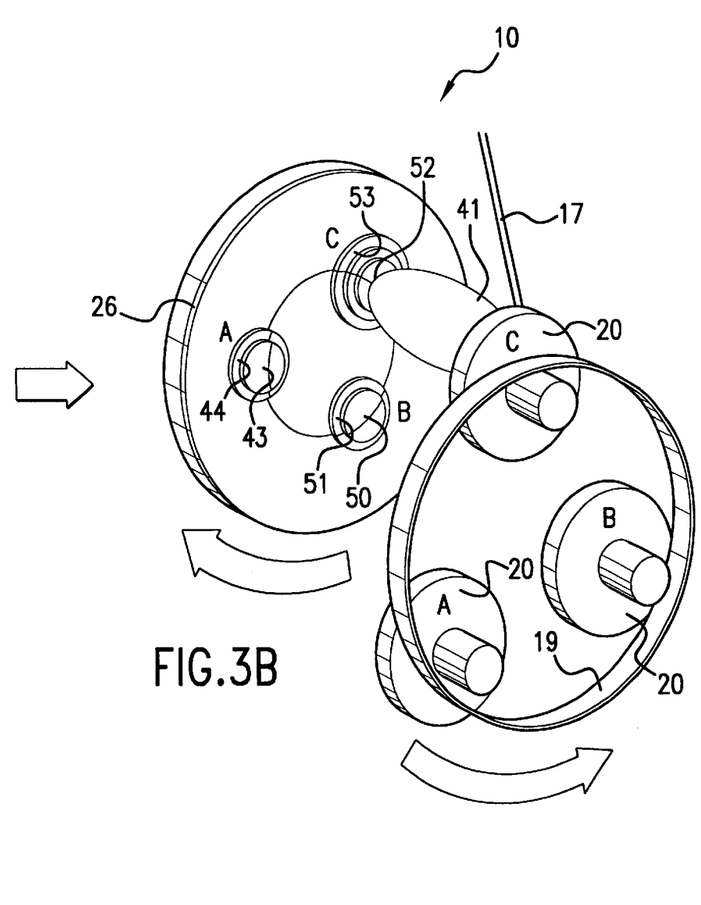
FIG. 3B shows schematically a rotating heater and a three target carousel controlled for subsequent repeated deposition of three materials from separate targets.

The resulting thickness profile of the material C deposited at the deposition center 52 and over the corresponding distributed deposition area 53 also decreases radially from the very center of the deposition center 52 to the periphery of the distributed deposition area 53, as best shown in FIG. 6B. Subsequent repeated deposition ABCABCABCA, etc. of three ingredient materials A, B, and C, from separate targets 20, results in three deposition centers 43, 50, and 52 with their respective distributed deposition areas 44, 51, and 53, respectively, separated on the substrate by 120° as shown in FIG. 3B.

As will be readily understood by those skilled in the art, the thickness of the resulting profile of the deposited material at each deposition center and the distributed deposition area depends on the duration of the laser ablation, i.e., the number of laser pulses "fired" onto the surface of a target 20.

The automated target carousel 19 allows a system user to predetermine how many laser pulses will be fired onto each material. In this condition, the path of the pulsed laser beam 17 remains unchanged while different targets 20 are subsequently moved into the proper position. Rotating at the same time the heater-substrate unit 27, controlled by the same control unit 35 that operates the laser 16 and the automated target carousel 19, three materials (or any other number of materials) may be deposited at predefined deposition centers on the substrate 25 in a predetermined sequence. For the example discussed herein, with three targets 20, the centers of the thickness profiles of the materials A, B, and C coincide with the corners of the equilateral triangle as best shown in FIG. 3B.

Figure 4A:
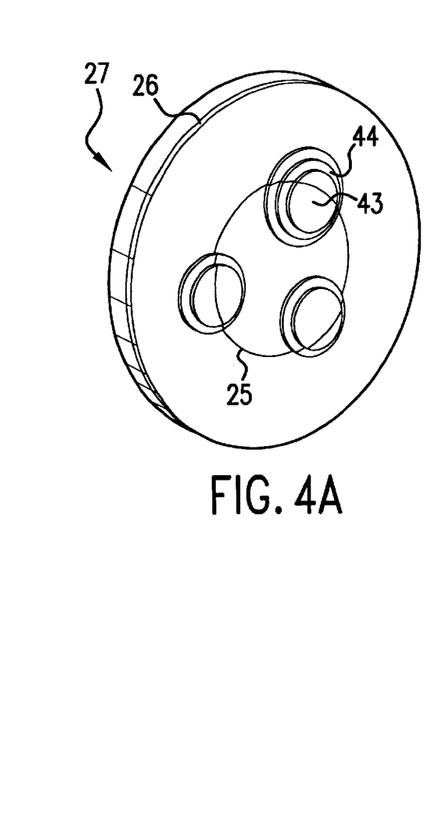
FIGS. 4a–4c show schematically subsequent deposition of three materials A, B, and C.
Figure 4B:
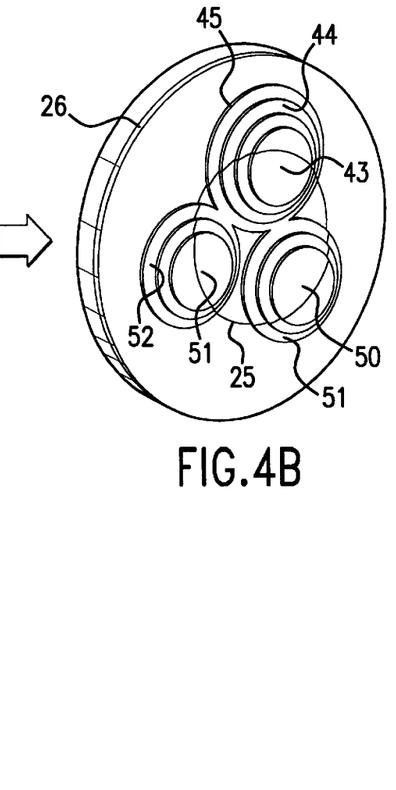
Figure 4C:
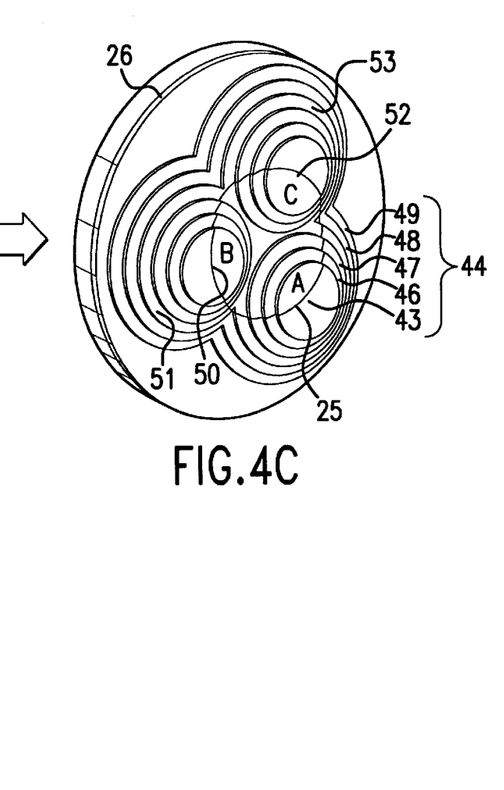

FIGS. 4A–4C illustrate the deposition method of the present invention. As shown in FIG. 4A, a number a of laser pulses are first fired onto the target formed of the material A (the target is not shown in FIGS. 4). Deposition is then interrupted, and the carousel 19 is rotated in order that the target formed of the material B is positioned in the beam path. Simultaneously, the heater-substrate unit 27 is rotated by 120° and a number b of laser pulses are fired. The procedure is then repeated for the material C. The carousel is rotated so that the target formed of the material C is positioned in the beam path. At the same time, the heater/substrate unit 27 is rotated by 120°, and number c of the laser pulses are fired. As a result of the subsequent deposition of three materials A, B, and C, best shown in FIGS. 4a–4c, and corresponding adjustment of the heater/substrate unit position, solid solution formation takes place throughout the substrate with the distributed deposition areas 44, 51, and 53 overlapping each with the other in a manner that the compositional spread created on the substrate 25 varies continuously between different regions as shown in FIG. 4C.

It is important that for any point on the substrate 25, deposition of a "shots" of the material A, plus b "shots" of the material B, plus c "shots" of the material C result in the deposition of less than one unit cell, so that intermixing will occur almost instantaneously, without the requirement of post-annealing. Subsequent deposition of the individual components is a proven method for the formation of solid solutions if less than a unit cell of each component is deposited before the next component is added. For example, the subsequent deposition of $KTaO_3$ and $KNbO_3$ results in the formation of $K(Ta_xNb_{1-x})O_3$. Also, superlattices can be grown automatically using this approach with monolayer control.

Figure 5:
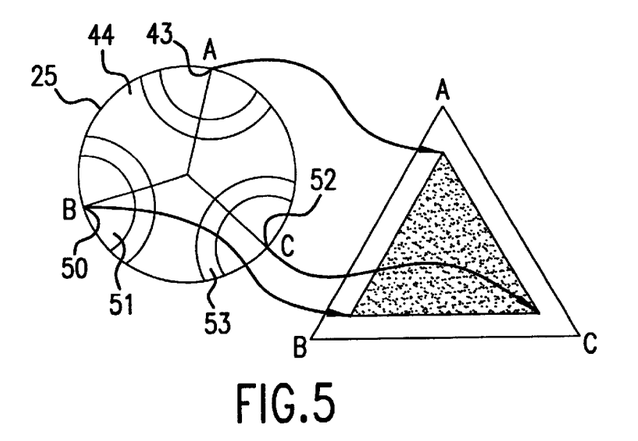
FIG. 5 is a diagram showing the varying composition across the substrate after deposition of a film as shown in FIGS. 4a–4c and the corresponding ternary phase diagram.

As a result of the deposition as described in the previous paragraphs, the substrate wafer 25 will be coated with a film that has a continuously varying composition, as illustrated in FIG. 5. The thickness profile of the deposition film for a planar substrate placed parallel to the target may be approximated by the following equation:

$$D(\gamma)=\cos^{P+3}(\gamma),$$

wherein $\cos^P(\gamma)$ determines the "source angular distribution". Typical values of p range from 2 to 10. The angle $\gamma$ shown in FIG. 3A, equals an angular distance between the center of each deposition center and the periphery of the corresponding distributed deposition area.

If the deposition rate profile for each of the three materials A, B, C is known, it is then possible to map each point on the substrate onto the standard ternary phase diagram as shown in FIG. 5. The deposition profile for each of the ingredient materials falls off gradually across the entire substrate, thus, for example, the area with the highest concentration of material A will also contain very small amounts of the materials B and C.

Therefore, the extreme points of the phase diagram cannot be accessed in this approach. However, those points are the most easily reached in a standard deposition, and this aspect of the method of the present invention does not represent a serious disadvantage. The relative concentrations of each individual ingredient material deposited on the surface of the substrate 25 change greatly between different points while the total thickness changes at a much lower rate.

All points of the phase diagram within the area 54 are obtained with the method of the present invention in one experiment. Scanning probe techniques, including, for example, scanning microwave microscopy, scanning mercury probe measurements, SEM, AFM, STM, etc., can then be used to determine physical properties of the entire wafer, and these properties can then be mapped onto the same phase diagram, as has been used in the case of co-sputtered dielectric films known to those skilled in the art.

Depending on the thickness profile for each individual ingredient material, the technique of the present invention may result in total thickness variations across the substrate 25 that complicate the characterization. Circumvention of this problem is possible by choosing a modified position procedure. In fact, as described in previous paragraphs, the method contemplates the deposition (for each step in the sequence) of all of the ingredient material A with the heater/substrate in one position, all of the material B with the heater/substrate in a position rotated 120° with respect to the first one, and all of the material C with the heater/substrate in position rotated 120° with respect to the previous one as shown in FIG. 6A which results in the three point deposition.

Figure 7A:
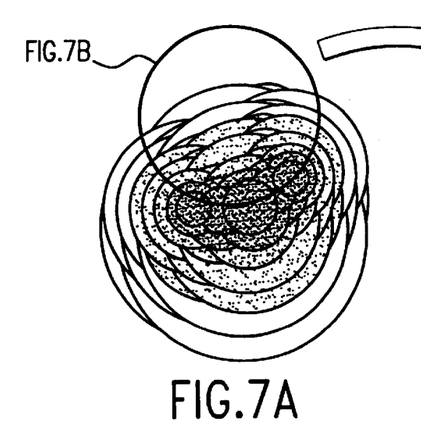
FIGS. 7A and 7B shows schematically the deposition resulting from the distributed deposition approach of FIG. 6B shown for one ingredient material.
Figure 7B:
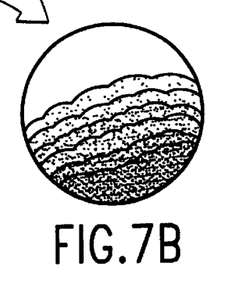

Alternatively, the deposition may be distributed more gradually as shown in FIG. 6B. According to the distributed deposition technique, the material A is deposited over a certain angular range deviated from 0° in both directions. Similarly, materials B and C also are deposited over the area deviated from 120° (for material B) in both directions, and from 240° (for material C) in both directions in order to form thickness profiles shown in FIG. 6B and FIG. 7. The profile used in a distributed deposition can be chosen so as to obtain a particular thickness profile across the substrate 25. The goal of such a technique is to modify the deposition profile for each material which allows mapping of the wafer onto the phase diagram more uniformly and thus more accurately.

The growth rate that can be achieved in the system of the present invention is obviously limited by the rate at which the heater/substrate and the target carousel can be switched. For a typical perovskite film of 1,000 angstrom thickness (i.e., 250 unit cells thick), about 500 cycles will be necessary. In the simple case of the three point deposition, this requires 1,500 individual deposition steps. With a typical growth rate of 1 Å per pulse, and a laser repetition rate of 10 Hz, the deposition time is small with respect to the time required for positioning the carousel 19 and the heater/substrate which is estimated to be approximately one second. Assuming that heating and cooling requires 30 minutes each, the entire ternary phase diagram can be deposited in about 1 ½ hours.

In the first embodiment of the system 10 of the present invention described in previous paragraphs and shown in FIGS. 3A and 3B, the position of the substrate/heater and the target carousel are adjusted between any two laser pulses whereas the optical path of the laser beam remains fixed.

Another embodiment contemplated in the scope of the present invention and best shown in FIG. 8, has a fixed heater/substrate and a computer controlled laser beam scanning system 34 which is formed by the combination of mirror and motorized actuators well known to those skilled in the art. The computer 35 controls the optical system 34 of the laser 16 to steer the laser beam from one target 20 to the next so that the deposition of materials A, B, and C in the predetermined sequence takes place on the different areas A, B, C on the substrate, as shown in FIG. 8.

To provide for greater flexibility and the use of small targets, either the target carousel or the heater may additionally be moved.

Although showing three disk-shaped targets on the carousel 19, it is contemplated in the scope of the present invention that different target arrangements could be brought into position by any mechanical or computer controlled mechanism. For example, a target consisting of "pizza slice-shaped" wedges 40 may be used as shown in FIG. 9 where wedges 40 of different ingredient materials are carried by the common disk 39 which can be rotated if used in the first embodiment of the system of the present invention, or would be immovable with the laser beam steering over the targets 40 if used in the second embodiment of the present invention.

The deposition centers of the substrate are not necessarily required to all lie on the same circle. Depending on the desired thickness distribution on the substrate 25, the laser spot can be moved across the target 20 or 40 in such a manner to obtain plume centers closer to, or further from the center of the substrate.

To allow higher flexibility and thickness distribution across the substrate 25, the heater/substrate unit 27 and/or the target carousel 19 can be linearly translated in one or more directions. Additionally, the optical system 34 can provide a beam scanning mechanism which allows the laser beam 17 to scan over the surface of each target 20 of each wedge 40 resulting in the same thickness flexibility.

It is important that the user of the system of the present invention is able to determine the compositional map across the sample without having to perform sophisticated chemical analysis. Ideally, measurement of the thickness of the entire multi-component film at a few selected points suffices to determine the elemental distribution based on a few basic assumptions that can be verified periodically on test wafers.

In view of this, there is a mathematical description of the thickness profile $D^i(r,\theta)$ for each component i for each point determined by the polar coordinates r and $\theta$. The thickness profile will in general depend on a number of experimental parameters, but in most cases, will be sufficiently defined by the laser energy density and background gas pressure. These are parameters that are nominally kept constant but can nevertheless vary from run to run. More easily controlled parameters, such as the target-substrate distance, are assumed constant and are generally not considered.

For materials i that are structurally similar, the function $D^i(r,\theta)$ can be written in terms of a normalized, material independent distribution $d(r,\theta)$, so that $$D^i(r,\theta)=a^i \cdot d(r,\theta),$$

where $a^i$ is the material dependence scalar (which is a growth rate). In general, $a^i$ will depend on the state of the surface of the target and must be treated as a variable. The thickness at any given point $(r,\theta)$ on the substrate is then found by the following equation:

$$d=a^1 \cdot d(r,\theta)+a^2 \cdot d(r,\theta+120°)+a^3 \cdot d(r,\theta+240°)$$

The entire distribution is thus defined entirely by the three growth rates $a^i$ and the growth parameters which include background pressure, laser energy, density.

It is thus sufficient to measure the total film thickness D at a finite number of test points $P_k$ to determine the entire compositional map.

The system of the present invention will allow the user to deposit or fabricate a number of different materials all on one sample and then analyze these materials at different portions of the sample which have different combinations of the materials on it in order to locate combinations of ingredient materials showing the searched for properties. The deposition film created on the substrate in the system of the present invention is a continuous spread with no boundaries between different materials. The user can calculate the composition at any point on the substrate by doing thickness measurements at certain positions with the use of calibration curves; or by measuring compositions by X-ray, diffraction, Rutherford backscattering, or any other spatially-resolved chemical analysis method. The continuous spread on the substrate with no boundary between different compositions created thereon allows for a higher number of different compositions created in one experiment which speeds up research and which is extremely important in the area of exploring new materials.

The system of the present invention takes advantage of pulsed laser deposition techniques and the continuous composition spread technique to create virtually all desirable materials and overcomes the cross-contamination issues of prior art systems which results in a cost effective approach to combinatorial synthesis.

Although this invention has been described in connection with specific forms and embodiments thereof, it will be appreciated that various modifications other than those discussed above may be resorted to without departing from the spirit or scope of the invention. For example, equivalent elements may be substituted for those specifically shown and described, certain features may be used independently of other features, and in certain cases, particular locations of elements may be reversed or interposed, all without departing from the spirit or scope of the invention as defined in the appended Claims.

What is claimed is:

1. Combinatorial synthesis system, comprising:

a plurality of targets arranged in a predetermined relationship therebetween, each of said targets being formed of a respective ingredient material;

a substrate displaced from said targets by a variably controlled distance, a plurality of deposition centers being defined at predetermined locations on said substrate circumferentially spaced apart each from the other, each of said depositions centers being in correspondence to a respective one of said targets, said substrate being rotatable about a central axis;

a focused energetic beam directed towards one of said targets and ejecting particulates of the ingredient material of said one of said targets, said ejected particulates being deposited at a respective one of said deposition centers corresponding to said one of said targets and at a distributed deposition area around said respective one of each said deposition centers, said distributed deposition area of said deposition centers on said substrate overlapping each with respect to the other; and, control means for sequentially controlling mutual disposition between said energetic beam and each of said targets, thereby coating said substrate with a deposition film having a continuously varying composition of the ingredient materials of said targets substantially at said distributed deposition areas between said deposition centers.

2. The combinatorial synthesis system of claim 1, wherein said control means further include first means for displacing said targets to focus said energetic beam onto a respective one of said targets, and second means for repositioning said substrate to align one of said deposition centers with said respective one of said targets.

3. The combinatorial synthesis system of claim 2, wherein said energetic beam is maintained stationary.

4. The combinatorial synthesis system of claim 1, wherein said control means further includes third means for counting a number of energetic pulses generated for each said targets dependent on thickness and composition of each said targets.

5. The combinatorial synthesis system of claim 1, wherein said control means include energetic beam steering unit for steering the energetic beam from one said targets to another.

6. The combinatorial synthesis system of claim 5, wherein said energetic beam steering unit further is adapted for scanning the energetic beam over the surface of each said targets.

7. The combinatorial synthesis system of claim 5, wherein said substrate is maintained stationary.

8. The combinatorial synthesis system of claim 1, wherein said plurality of targets include disk-shaped targets spaced each from the other on a target carousel.

9. The combinatorial synthesis system of claim 1, wherein said plurality of targets include wedge-shaped targets radially disposed on a common support and angularly spaced thereon.

10. The combinatorial synthesis system of claim 1, further including a heater, said substrate being mounted on said heater.

11. The combinatorial synthesis system of claim 1, further including a vacuum chamber, said vacuum chamber having walls circumferencing an interior of said vacuum chamber receiving said targets and said substrate therein, said walls further having a port defined therein and adapted to allow the energetic beam to pass therethrough into said interior of said vacuum chamber and to engage the surface of said one of said targets.

12. The combinatorial synthesis system of claim 1, further including a translation unit coupled to said substrate for changing said predetermined distance between said substrate and said targets.

13. The combinatorial synthesis system of claim 1, wherein said energetic beam is a laser beam.

14. The combinatorial synthesis system of claim 1, wherein said energetic beam is a pulsed electron beam.

15. The combinatorial synthesis system of claim 1, wherein said control means further includes third means for controlling exposure time of each said targets to said energetic beam dependent upon thickness and composition of each said targets.

\* \* \* \* \*